US012665583B2

(12) United States Patent
Fu

(10) Patent No.: US 12,665,583 B2
(45) Date of Patent: Jun. 23, 2026

(54) SIGNAL TRANSMISSION DEVICE CAPABLE OF SHORTENING TURN-OFF TIME OF CONTROLLED SOURCE IN ELECTROMAGNETIC METHOD

(71) Applicant: HUNAN UNIVERSITY OF SCIENCE AND TECHNOLOGY, Xiangtan (CN)

(72) Inventor: Guohong Fu, Xiangtan (CN)

(73) Assignee: HUNAN UNIVERSITY OF SCIENCE AND TECHNOLOGY, Xiangtan (CN)

( * ) Notice: Subject to any disclaimer, the term of this patent is extended or adjusted under 35 U.S.C. 154(b) by 0 days.

(21) Appl. No.: 18/945,463

(22) Filed: Nov. 12, 2024

(65) Prior Publication Data

US 2025/0070767 A1 Feb. 27, 2025

(30) Foreign Application Priority Data

Feb. 23, 2024 (CN) .......................... 202410202735.6

(51) Int. Cl.
*H03K 5/01* (2006.01)

(52) U.S. Cl.
CPC ...................................... *H03K 5/01* (2013.01)

(58) Field of Classification Search
CPC ............... H03K 5/01; H04B 1/04; G01V 3/10
See application file for complete search history.

(56) References Cited

U.S. PATENT DOCUMENTS

2022/0221612 A1* 7/2022 Fu ........................... G01V 3/38

FOREIGN PATENT DOCUMENTS

CN 111313916 A 6/2020

* cited by examiner

*Primary Examiner* — Metasebia T Retebo

(57) ABSTRACT

A signal transmission device for reducing a turn-off time of an electromagnetic controlled source includes a first electronic switch, a twisted pair cable and a second electronic switch. The first electronic switch constitutes a bridge arm, and includes a first bridge arm switch, a second bridge arm switch, a third bridge arm switch and a fourth bridge arm switch. The second electronic switch is configured to control turn-on and turn-off of the twisted pair cable. The signal transmission device and ground constitute a signal transmission loop.

4 Claims, 6 Drawing Sheets

SIGNAL TRANSMISSION DEVICE CAPABLE OF SHORTENING TURN-OFF TIME OF CONTROLLED SOURCE IN ELECTROMAGNETIC METHOD

CROSS-REFERENCE TO RELATED APPLICATIONS

This application claims the benefit of priority from Chinese Patent Application No. 202410202735.6, filed on Feb. 23, 2024. The content of the aforementioned application, including any intervening amendments thereto, is incorporated herein by reference in its entirety.

TECHNICAL FIELD

This application relates to electrical prospecting and electromagnetic prospecting technologies, and more particularly to a signal transmission device capable of shortening turn-off time of controlled source in electromagnetic method.

BACKGROUND

In electrical prospecting and electromagnetic prospecting, an electrical transmitter generally uses a single long wire to connect the ground to form a closed loop and output current. The current in an output wire generates and radiates an electromagnetic signal, and loads a current signal to the ground. Owing to the existence of a wire inductance, a turn-off time of the current is generally long. In the application of time domain electrical method and time domain electromagnetic method, a relative long turn-off time of transmitting current seriously interferes a secondary field signal, and affects an acquisition of a signal in an early stage and a signal-to-noise ratio in a later stage. In the application of frequency domain electrical method and frequency domain electromagnetic method, the relative long turn-off time of transmitting current affects a high frequency characteristic of a transmitting signal and the quality of observation data.

At present, it is a difficult problem in electrical prospecting and electromagnetic prospecting, especially in time domain electrical method and time domain electromagnetic method to shorten a turn-off time of a primary field.

The Chinese Patent Publication No. 111313916 A only focuses on a transmission situation of ungrounded transient electromagnetic (magnetic source) signal, and cannot include a transmission situation of grounded transient electromagnetic signal and a transmission situation of electromagnetic signal of frequency domain electrical source, which has no universality. In its technical solution, a transmitting circuit performs transmission in two-wire series connection state, and two twisted pair cables are in parallel when it is turned off. The transmitting circuit is complex and needs numerous electronic switches, which has poor reliability and long delay time of switchover between multiple electronic switches.

SUMMARY

In order to solve the above problems, this application is to provide a signal transmission device capable of shortening turn-off time of controlled source in electromagnetic method with a simple structure, provides a signal transmission method for shortening turn-off time of controlled source in electromagnetic method.

Technical solutions of this application are described as follows.

A signal transmission device capable of shortening turn-off time of controlled source in electromagnetic method is provided, comprising:

a first electronic switch;

a twisted pair cable; and a second electronic switch;

wherein the first electronic switch constitutes a bridge arm; the second electronic switch is configured to control turn-on and turn-off of the twisted pair cable; the first electronic switch comprises a first bridge arm switch, a second bridge arm switch, a third bridge arm switch and a fourth bridge arm switch; the second electronic switch comprises a first switch and a second switch; a first end of the first bridge arm switch and a first end of the third bridge arm switch are connected together and then are connected with a power supply; a second end of the first bridge arm switch and a first end of the second bridge arm switch are connected together and then are configured as a first output end A1 of the bridge arm to connect with a first end of the first switch; a second end of the third bridge arm switch and a first end of the fourth bridge arm switch are connected together and then are configured as a second output end B1 of the bridge arm to connect with a second grounding terminal B2 through a wire; a second end of the second bridge arm switch and a second end of the fourth bridge arm switch are connected together and then are grounded; a second end of the first switch is connected with a first grounding terminal A2 through the twisted pair cable and the second switch; and the signal transmission device and ground constitute a signal transmission loop.

In an embodiment, the twisted pair cable comprises one twisted pair cable with short circuit on both ends, or a plurality of twisted pair cables with short circuit on both ends connected in series.

A signal transmission method for shortening turn-off time of controlled source in electromagnetic method is provided, comprising:

in a case that the first output end A1 outputs a current, connecting the first bridge arm switch, connecting the fourth bridge arm switch, disconnecting the second bridge arm switch, disconnecting the third bridge arm switch, connecting the first switch and connecting the second switch; wherein the current is output from the first output end A1, and flows through the first switch, a left end of the twisted pair cable, a right end of the twisted pair cable, the second switch, the first grounding terminal A2, the ground, and the second grounding terminal B2 sequentially to the second output end B1;

in a case that the second output end B1 outputs the current, connecting the second bridge arm switch, connecting the third bridge arm switch, disconnecting the first bridge arm switch, disconnecting the fourth bridge arm switch, connecting the first switch, and connecting the second switch; wherein the current is output from the second output end B1, and flows through the second grounding terminal B2, the ground, the first grounding terminal A2, the second switch, the right end of the twisted pair cable, the left end of the twisted pair cable, and the first switch sequentially to the first output end A1;

wherein during signal transmission, the current in the twisted pair cable externally radiates an electromagnetic field signal, and the current in the ground loads a current signal to the ground; and when the current is turned off, the first bridge arm switch, the second bridge arm switch, the third bridge arm switch, the fourth bridge arm switch, the first switch and the second switch are disconnected, an external radiation magnetic field of the twisted pair cable is reduced to zero, and the current in the ground is also reduced to zero.

In an embodiment, the twisted pair cable, through the second switch, can be directly form a short circuit with the second output end B1; the current in the twisted pair cable is controlled to radiate the electromagnetic signal; the twisted pair cable constitutes the signal transmission device with one or multiple twisted pair cable coils; a turn-off time of the current in the one or multiple twisted pair cable coils is shorter than that in a coil formed by a single wire; and the signal transmission method is implemented to radiate a time domain electromagnetic signal or a frequency domain electromagnetic signal.

This application has the following beneficial effects.

This application can significantly shorten the turn-off time of the electromagnetic field radiated by the output wire and the turn-off time of the ground current. In the application of the time domain electrical method and time domain electromagnetic method, this application can effectively measure a signal in an early stage, and improve a signal-to-noise ratio in a later stage. In the application of the frequency domain electrical method and frequency domain electromagnetic method, this application can effectively shorten the turn-off time of an output rectangular wave current, and improve a high frequency characteristic when the current is turned off.

DETAILED DESCRIPTION OF EMBODIMENTS

The present disclosure will be further described with reference to the accompanying drawings and embodiments.

Figure 1:
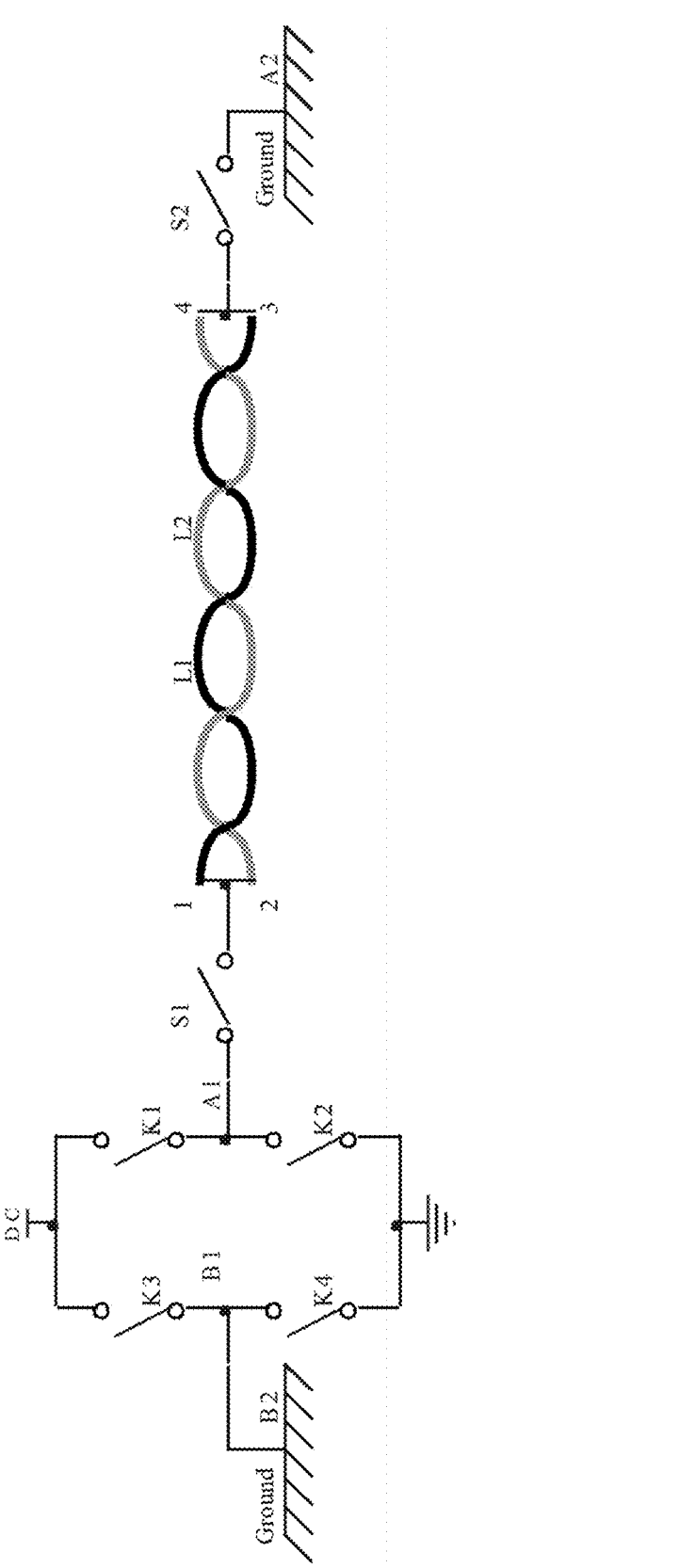
FIG. 1 schematically shows a signal transmission device capable of shortening turn-off time of controlled source in electromagnetic method according to an embodiment of the present disclosure.

Referring to FIG. 1, a signal transmission device capable of shortening turn-off time of controlled source in electromagnetic method includes a first electronic switch, a twisted pair cable and a second electronic switch. The first electronic switch constitutes a bridge arm. The second electronic switch is configured to control turn-on and turn-off of the twisted pair cable. The first electronic switch includes a first bridge arm switch K1, a second bridge arm switch K2, a third bridge arm switch K3 and a fourth bridge arm switch K4. The second electronic switch includes a first switch S1 and a second switch S2. A first end of the first bridge arm switch K1 and a first end of the third bridge arm switch K3 are connected together and then are connected with a power supply. A second end of the first bridge arm switch K1 and a first end of the second bridge arm switch K2 are connected together and then are configured as a first output end A1 of the bridge arm to connect with a first end of the first switch S1. A second end of the third bridge arm switch K3 and a first end of the fourth bridge arm switch K4 are connected together and then are configured as a second output end B1 of the bridge arm to connect with a second grounding terminal B2 through a wire. A second end of the second bridge arm switch K2 and a second end of the fourth bridge arm switch K4 are connected together and then are grounded. A second end of the first switch S1 is connected with a first grounding terminal A2 through the twisted pair cable and the second switch S2. The signal transmission device and ground constitute a signal transmission loop. The twisted pair cable includes one twisted pair cable with short circuit on both ends, or a plurality of twisted pair cables with short circuit on both ends connected in series.

A signal transmission method for shortening turn-off time of controlled source in electromagnetic method includes the following steps.

In a case that the first output end A1 outputs a current, the first bridge arm switch K1 is connected, the fourth bridge arm switch K4 is connected, the second bridge arm switch K2 is disconnected, the third bridge arm switch K3 is disconnected, the first switch S1 is connected, and the second switch S2 is connected; where the current is output from the first output end A1, and flows through the first switch S1, a left end of the twisted pair cable, a right end of the twisted pair cable, the second switch S2, the first grounding terminal A2, the ground, and the second grounding terminal B2 sequentially to the second output end B1.

In a case that the second output end B1 outputs the current, the second bridge arm switch K2 is connected, the third bridge arm switch K3 is connected, the first bridge arm switch K1 is disconnected, the fourth bridge arm switch K4 is connected, the first switch S1 is connected, and the second switch S2 is connected; where the current is output from the second output end B1, and flows through the second grounding terminal B2, the ground, the first grounding terminal A2, the second switch S2, the right end of the twisted pair cable, the left end of the twisted pair cable, and the first switch S1 sequentially to the first output end A1.

During signal transmission, the current in the twisted pair cable externally radiates an electromagnetic field signal, and the current in the ground loads a current signal to the ground. When the current is turned off, the first bridge arm switch K1, the second bridge arm switch K2, the third bridge arm switch K3, the fourth bridge arm switch K4, the first switch S1 and the second switch S2 are disconnected, an external radiation magnetic field of the twisted pair cable is reduced to zero, and the current in the ground is also reduced to zero.

After turn-off, the twisted pair cable may generate an oscillating current, which will be concentrated and oscillate in a resistive twisted pair cable. The current in two wires of the twisted pair cable is always equal and opposite. Opposite, after a single wire with the same length is turned off, a self-inductance of the single wire will inevitably cause oscillation, and the turn-off time of the single wire is more than ten times longer than that of the present disclosure.

Figure 2:
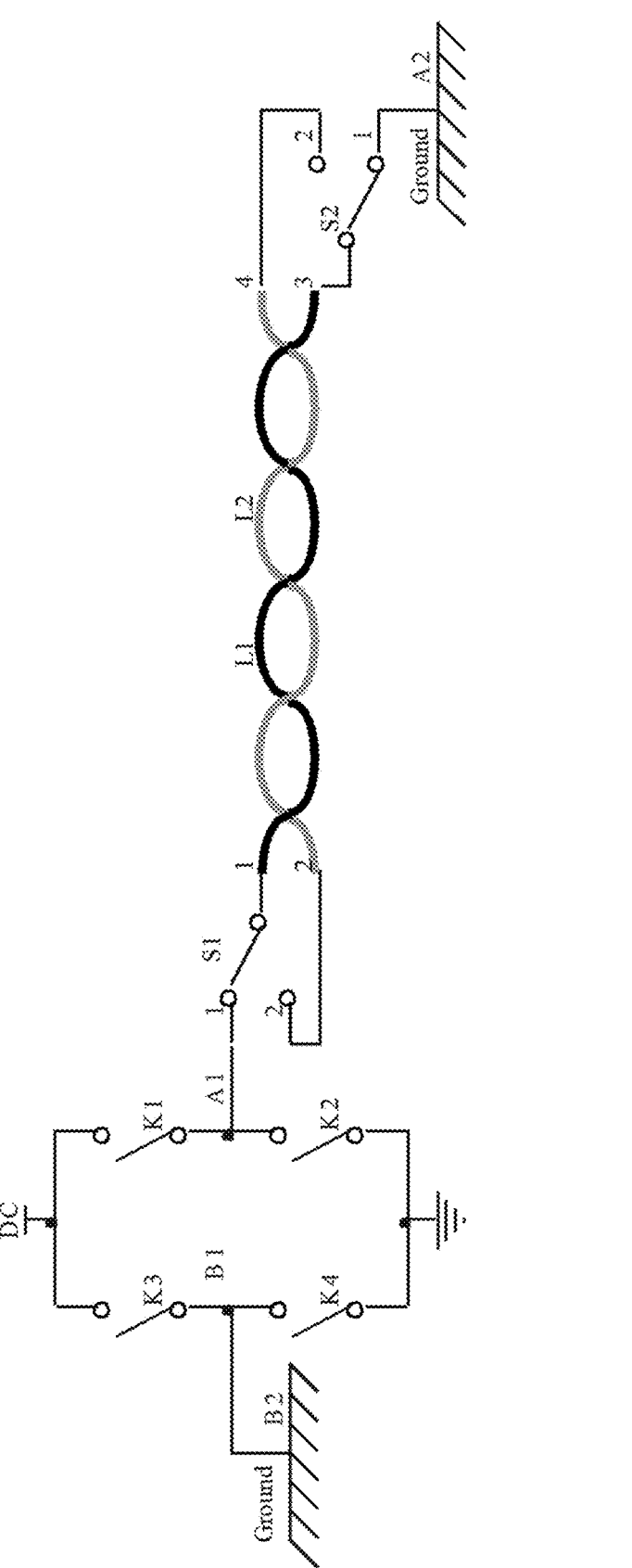
FIG. 2 schematically shows a circuit when a signal wire outputs a current and an output current of a twisted pair cable is turned off according to an embodiment of the present disclosure.

FIG. 2 schematically shows a circuit when a signal wire outputs a current and an output current of a twisted pair cable is turned off. The signal transmission loop includes the first electronic switch, a cable, and the second electronic switch, where the cable includes a single output wire or the twisted pair cable switched when the current is turn off; both ends of the cable are connected with the second electronic switch. In a case that outputting the current, the first switch S1 and the second switch S2 are placed at a first end 1. A left end of a first wire L1 is connected with the first output end A1 through the first switch S1, and a right end of the first wire L1 is connected with the first grounding terminal A2 through the second switch S2 and the ground. The second output end B1 is connected with the ground at the second grounding terminal B2. An output circuit and the ground constitute the signal transmission loop. In a case that the first output end A1 outputs a current, the first bridge arm switch K1 is connected, the fourth bridge arm switch K4 is connected, the second bridge arm switch K2 is disconnected, the third bridge arm switch K3 is disconnected, and the first switch S1 and the second switch S2 are placed at the first end 1. The current in the first wire L1 is input through the left end and output through the right end, and supplies power to the ground. In a case that the second output end B1 outputs the current, the first bridge arm switch K1 is disconnected, the fourth bridge arm switch K4 is connected, the second bridge arm switch K2 is connected, the third bridge arm switch K3 is connected, and the first switch S1 and the second switch S2 are placed at the first end 1. The current in the first wire L1 is input through the right end and output through the left end. When the current is turned off, the first bridge arm switch K1, the fourth bridge arm switch K4, the second bridge arm switch K2, and the third bridge arm switch K3 are disconnected respectively, and the first switch S1 and the second switch S2 are placed at a second end 2. The first wire L1 and a second wire L2 constitute the twisted pair cable. An external radiation magnetic field of the twisted pair cable is reduced to zero, and the current in the ground is also reduced to zero. After turn-off, the twisted pair cable may generate the oscillating current, which will be concentrated and oscillate in a resistive twisted pair cable. The current in the two wires of the twisted pair cable is always equal and opposite. Opposite, after the single wire with the same length is turned off, a self-inductance of the single wire will inevitably cause oscillation, and the turn-off time of the single wire is more than ten times longer than that of the present disclosure.

Figure 3:
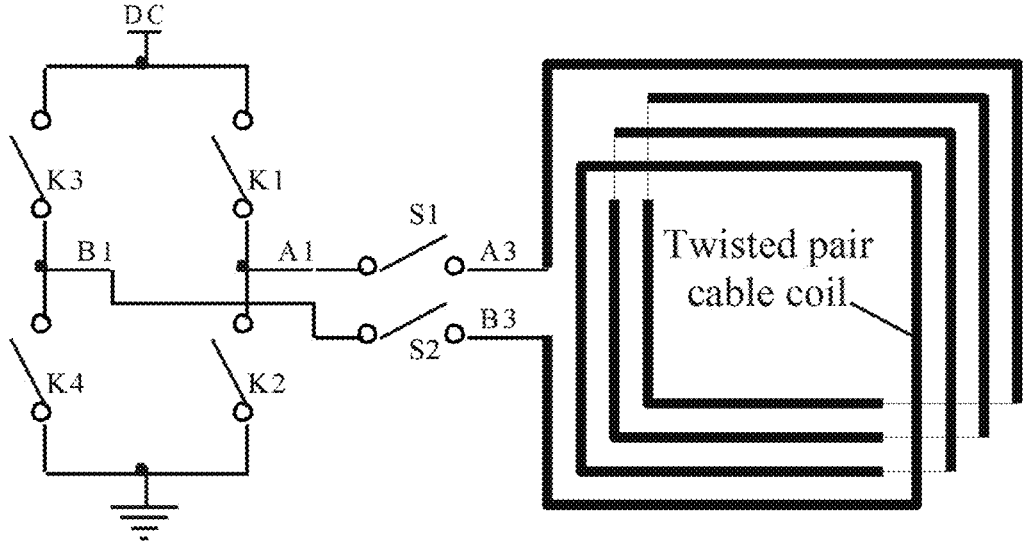
FIG. 3 schematically shows a circuit during magnetic source signal transmission according to an embodiment of the present disclosure.

FIG. 3 schematically shows a circuit during magnetic source signal transmission. A magnetic source signal is transmitted by a single-turn, two-turn or multi-turn coil reeled by the twisted pair cable. A first end of the twisted pair cable A3 is connected with the first output end A1 through the first switch S1, and a second end of the twisted pair cable B3 is connected with the second output end B1 through the second switch S2. When the signal is output, the first switch S1 and the second switch S2 are connected, the first bridge arm switch K1 is connected, the fourth bridge arm switch K4 is connected, and the second bridge arm switch K2 and the third bridge arm switch K3 are disconnected. The current in the coil is input through the first end of the twisted pair cable A3 and output through the second end of the twisted pair cable B3, and the coil radiates the magnetic source signal. When the first bridge arm switch K1 and the fourth bridge arm switch K4 are disconnected, the second bridge arm switch K2 is connected, and the third bridge arm switch K3 is connected, the current in the coil is input through the second end of the twisted pair cable B3 and output through the first end of the twisted pair cable A3, and the coil radiates an opposite magnetic source signal. When the current is turned off, the first bridge arm switch K1, the fourth bridge arm switch K4, the second bridge arm switch K2, the third bridge arm switch K3, the first switch S1 and the second switch S2 are disconnected respectively, the current in the coil is quickly turned off, and a radiation magnetic field signal is quickly reduced to zero. Compared to a transmission coil reeled by the single wire, a current turn-off time, that is, a magnetic field turn-off time of the present disclosure is shorten more than ten times. The present disclosure can improve a high frequency characteristic of a frequency domain electromagnetic method. In particular, in the application of a time domain electromagnetic method, the present disclosure can significantly shorten the current turn-off time, ensuring a signal quality in an early stage and improving signal-to-noise ratio in a later stage.

Figure 4:
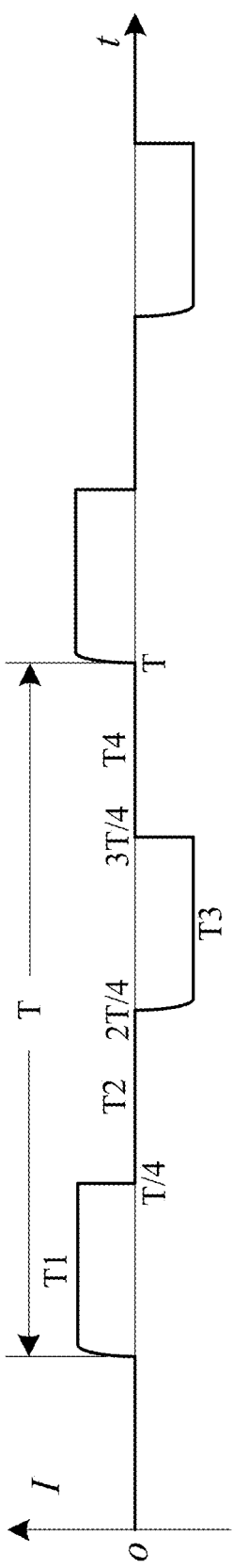
FIG. 4 is a wave diagram when a controlled source outputs a bipolar square wave current signal according to an embodiment of the present disclosure.

FIG. 4 is a wave diagram when a controlled source outputs a bipolar square wave current signal. In the application of the time domain electromagnetic method, the shorter the turn-off time, the shallower an observation blind area, the higher a signal-to-noise ratio of the signal. The present disclosure can significantly reduce the observation blind area and improve a data quality of deep prospecting. In the application of the time domain electrical method, the shorter the turn-off time, the better the observation data quality, the higher the prospecting measurement accuracy. In the application of the frequency domain electromagnetic method, the shorter the turn-off time, the better the high frequency signal quality, which can improve the efficiency during high frequency signal transmission and the signal-to-noise ratio of a received signal.

Figure 5:
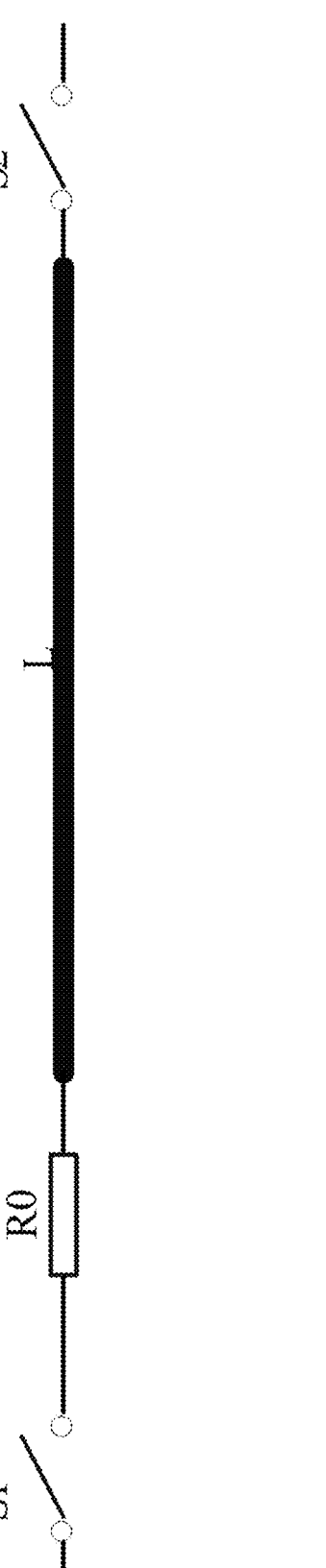
FIG. 5 schematically shows a circuit of a turn-off test for single wire and twisted pair cable according to an embodiment of the present disclosure.

In FIG. 1, the first bridge arm switch K1, the second bridge arm switch K2, the third bridge arm switch K3 and the fourth bridge arm switch K4 are respectively configured to output a square wave current in different direction. In a case that the first bridge arm switch K1 is connected, the fourth bridge arm switch K4 is connected, the second bridge arm switch K2 is disconnected and the third bridge arm switch K3 is disconnected, the current flows through the first output end A1, an external circuit and the second output end B1, sequentially, and the current in the twisted pair cable is from left to right. In a case that the first bridge arm switch K1 is disconnected, the fourth bridge arm switch K4 is disconnected, the second bridge arm switch K2 is connected and the third bridge arm switch K3 is connected, the current flows through the second output end B1, the external circuit and the first output end A1, sequentially, and the current in the twisted pair cable is from right to left. When the current is turned off, the first bridge arm switch K1, the fourth bridge arm switch K4, the second bridge arm switch K2 and the third bridge arm switch K3 are respectively disconnected, and the first switch S1 and the second switch S2 on both ends of the twisted pair cable are disconnected. The current in the twisted pair cable is quickly turned off, a field radiated by the current of the twisted pair cable is quickly reduced to zero, and the current supplied to the ground is also quickly reduced to zero. When the twisted pair cable is replaced by the single wire connected to the ground (a test circuit is shown in FIG. 5), the turn-off time is much longer, and a comparison test date is shown in Table 1.

TABLE 1

| Comparison test date of single wire and twisted pair cable | | | | |
|---|---|---|---|---|
| L | Internal resistance r | Sample resistance R0 | R0 + r | Complete turn-off time |
| 40 m of the single wire | 1.02Ω | 1.00Ω | 2.02Ω | 600 μS |
| 40 m of the twisted pair cable in parallel | 0.51Ω | 1.50Ω | 2.01Ω | 24 μS |

In FIG. 1, a right end of the second switch S2 is in short-circuiting with the second output end B1, and the twisted pair cable is reeled to form single-turn, two-turn or multi-turn coil. The first bridge arm switch K1, the second bridge arm switch K2, the third bridge arm switch K3 and the fourth bridge arm switch K4 are respectively configured to output the square wave current in different direction. The first bridge arm switch K1 is connected, the fourth bridge arm switch K4 is connected, the second bridge arm switch K2 is disconnected and the third bridge arm switch K3 is disconnected. The current flows through the first output end A1, the first switch S1, the twisted pair cable, the second switch S2 and the second output end B1, sequentially. The twisted pair cable externally radiates a magnetic field signal. When the first bridge arm switch K1 is disconnected, the fourth bridge arm switch K4 is disconnected, the second bridge arm switch K2 is connected, and the third bridge arm switch K3 is connected, the current flows through the second output end B1, the second switch S2, the twisted pair cable, the first switch S1 and the first output end A1, sequentially, the twisted pair cable externally radiates an opposite magnetic field signal. When the first bridge arm switch K1 is disconnected, the fourth bridge arm switch K4 is disconnected, the second bridge arm switch K2 is disconnected and the third bridge arm switch K3 is disconnected, the current in the twisted pair cable and the magnetic field signal radiated by the twisted pair cable are turned off. The turn-off time of the present disclosure is much shorter than that in a situation of the transmission coil is reeled by the single wire.

A precise synchronization of the first bridge arm switch K1, the fourth bridge arm switch K4, the second bridge arm switch K2, the third bridge arm switch K3, the first switch S1 and the second switch S2 can be perform by wired synchronization, Beidou satellite synchronization, global positioning system (GPS) satellite synchronization and atomic clock synchronization. When the coil reeled by the twisted pair cable of the present disclosure is adopted to radiate the magnetic field signal, the turn-on and turn-off of the first bridge arm switch K1, the fourth bridge arm switch K4, the second bridge arm switch K2, the third bridge arm switch K3, the first switch S1 and the second switch S2 can be controlled by a controller to realize a strict synchronous switching of the electronic switches.

The first bridge arm switch K1, the second bridge arm switch K2, the third bridge arm switch K3, the fourth bridge arm switch K4, the first switch S1 and the second switch S2 adopt a high-speed electronic switching devices (such as gallium nitride field effect transistor (GaN FET) and high-speed metal-oxide semiconductor field-effect transistor (MOSFET)) to design a switching circuit, which can control the turn-on time and turn-off time of the electronic switching devices in nanoseconds.

Figure 6:
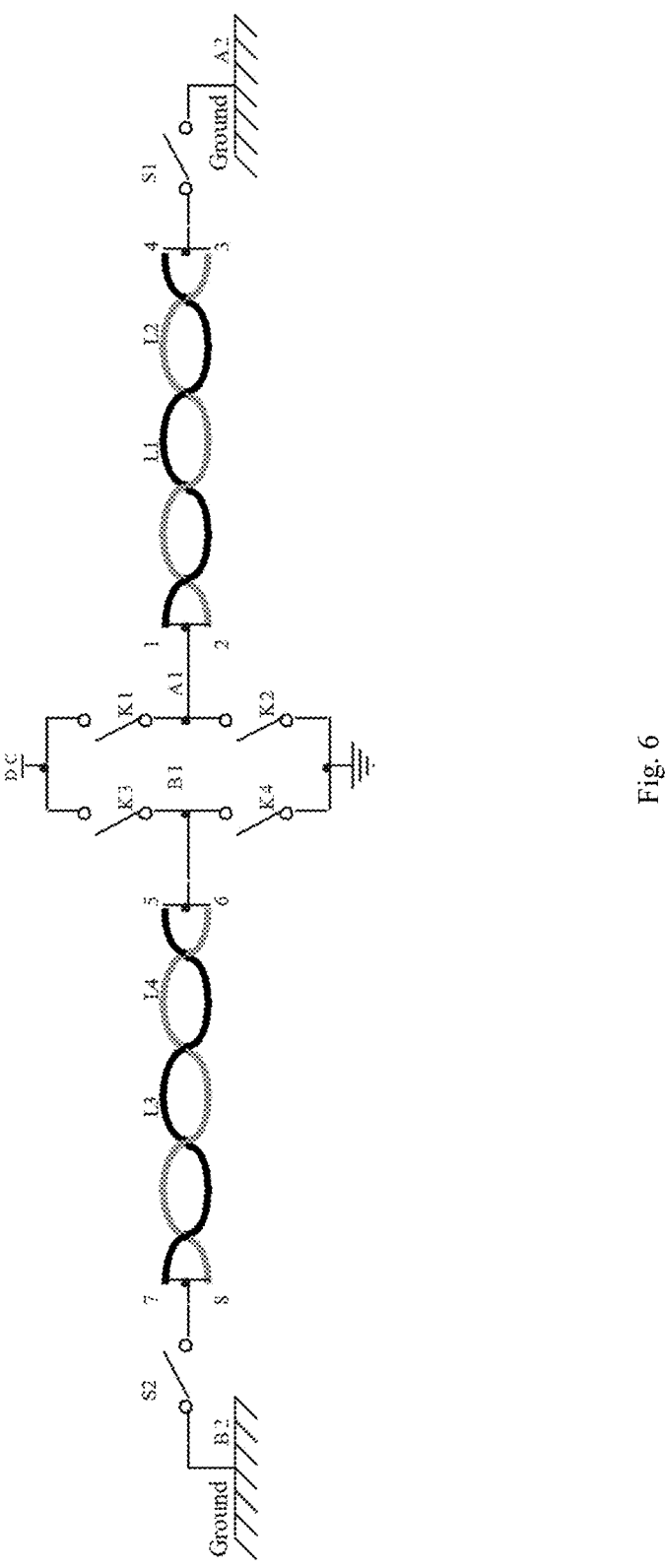
FIG. 6 schematically shows a circuit of transmitting signal balance according to an embodiment of the present disclosure.

FIG. 6 schematically shows a circuit of transmitting signal balance. The signal transmission loop includes the first electronic switch, two twisted pair cables, and the second electronic switch, where the first electronic switch constitute the bridge arm; the two twisted pair cables are configured to connected with two output ends, respectively; the second electronic switch is configured to control turn-on and turn-off of the two twisted pair cables; and the two twisted pair cables include a first twisted pair cable and a second twisted pair cable. In a case that outputting the current, the first switch S1 is connected, and the second switch S2 is connected. A left end of the second twisted pair cable is connected with the first output end A1, and a right end of the second twisted pair cable is connected with the first grounding terminal A2. A right end of the first twisted pair cable is connected with the second output end B1, and a left end of the first twisted pair cable is connected with the second grounding terminal B2. An output circuit and the ground constitute the signal transmission loop. In a case that the first output end A1 outputs the current, the first bridge arm switch K1 is connected, the fourth bridge arm switch K4 is connected, the second bridge arm switch K2 is disconnected, the third bridge arm switch K3 is disconnected, the first switch S1 is connected, and the second switch S2 is connected, the current in the first twisted pair cable and the second twisted pair cable flows from left to right, and a ground current flows into the ground through the first grounding terminal A2 and flows out of the second grounding terminal B2. In a case that the second output end B1 outputs the current, the third bridge arm switch K3 is connected, the second bridge arm switch K2 is connected, the first bridge arm switch K1 is disconnected, the fourth bridge arm switch K4 is disconnected, the first switch S1 is connected, and the second switch S2 is connected, the current in the first twisted pair cable and the second twisted pair cable flows from right to left, and the ground current flows reversely. When the current is turned off, the first bridge arm switch K1, the second bridge arm switch K2, the third bridge arm switch K3, the fourth bridge arm switch K4, the first switch S1 and the second switch S2 are disconnected, respectively, the external radiation magnetic field of first twisted pair cable and the second twisted pair cable is quickly reduced to zero, and the current in the ground is quickly also reduced to zero. After turn-off, the two twisted pair cables may generate the oscillating current, which will be concentrated and oscillate in the resistive twisted pair cable. The current in the two wires of each of the two twisted pair cables is always equal and opposite. After the single wire with the same length is turned off, the self-inductance of the single wire will inevitably cause oscillation, and the turn-off time of the single wire is more than ten times longer than that of the present disclosure.

The present disclosure eliminates the disadvantages of long turn-off time caused by the inductance of output loop in the controlled source electrical method and the electromagnetic method, especially in the application of the time domain electrical method and time domain electromagnetic method, the present disclosure can fully ensure the signal quality in the early stage and improve the signal-to-noise ratio in the later stage.

Embodiments of the present disclosure are introduced in a case of rectangular wave transmission, but the present disclosure is also applicable for other waveforms, such as triangular wave and trapezoidal wave, when the current needs to be quickly turned off at any time. The present disclosure is also applicable for a unipolar wave current or a bipolar wave current. The first switch S1 and the second switch S2 are disconnected can quickly turn off the current flowing into or out of the twisted pair cable to turn off the electromagnetic field radiated by the twisted pair cable.

The present disclosure is applicable to not only the controlled source signal transmission in geophysical electromagnetic prospecting, but also the situation that the current in the wire or the coil needs to be quickly turned off. It is only to replace the single wire or the coil with the cable twisted pair cable and add the electronic switches which are in synchronizing connection or disconnection on both ends of the twisted pair cable to realize the effect of fast turn-off of the current. Therefore, other similar circumstance shall also be within the scope of the present disclosure.

What is claimed is:

1. A signal transmission device shortening turn-off time of controlled source in electromagnetic method, comprising:

a first electronic switch;

a twisted pair cable; and a second electronic switch;

wherein the first electronic switch constitutes a bridge arm; the second electronic switch is configured to control turn-on and turn-off of the twisted pair cable; the first electronic switch comprises a first bridge arm switch, a second bridge arm switch, a third bridge arm switch and a fourth bridge arm switch; the second electronic switch comprises a first switch and a second switch; a first end of the first bridge arm switch and a first end of the third bridge arm switch are connected together and then are connected with a power supply; a second end of the first bridge arm switch and a first end of the second bridge arm switch are connected together and then are configured as a first output end (A1) of the bridge arm to connect with a first end of the first switch; a second end of the third bridge arm switch and a first end of the fourth bridge arm switch are connected together and then are configured as a second output end (B1) of the bridge arm to connect with a second grounding terminal (B2) through a wire; a second end of the second bridge switch and a second end of the fourth bridge arm switch are connected together and then are grounded; a second end of the first switch is connected with a first grounding terminal (A2) through the twisted pair cable and the second switch; and the signal transmission device and ground constitute a signal transmission loop.

2. The signal transmission device of claim 1, wherein the twisted pair cable comprises one twisted pair cable with short circuit on both ends, or a plurality of twisted pair cables with short circuit on both ends connected in series.

3. A signal transmission method for shortening turn-off time of controlled source in electromagnetic method using the signal transmission device of claim 1, comprising:

when the first output end (A1) outputs a current, connecting the first bridge arm switch, connecting the fourth bridge arm switch, disconnecting the second bridge arm switch, disconnecting the third bridge arm switch, connecting the first switch and connecting the second switch; wherein the current is output from the first output end (A1), and flows through the first switch, a left end of the twisted pair cable, a right end of the twisted pair cable, the second switch, the first grounding terminal (A2), the ground, and the second grounding terminal (B2) sequentially to the second output end (B1); and when the second output end (B1) outputs the current, connecting the second bridge arm switch, connecting the third bridge arm switch, disconnecting the first bridge arm switch, disconnecting the fourth bridge arm switch, connecting the first switch, and connecting the second switch; wherein the current is output from the second output end (B1), and flows through the second grounding terminal (B2), the ground, the first grounding terminal (A2), the second switch, the right end of the twisted pair cable, the left end of the twisted pair cable, and the first switch sequentially to the first output end (A1);

wherein during signal transmission, the current in the twisted pair cable externally radiates an electromagnetic field signal, and the current in the ground loads a current signal to the ground; and when the current is turned off, the first bridge arm switch, the second bridge arm switch, the third bridge arm switch, the fourth bridge arm switch, the first switch and the second switch are disconnected, an external radiation magnetic field of the twisted pair cable is reduced to zero, and the current in the ground is also reduced to zero.

4. The method of claim 3, wherein the twisted pair cable, through the second switch, can be directly form a short circuit with the second output end (B1); the current in the twisted pair cable is controlled to radiate the electromagnetic signal; the twisted pair cable constitutes the signal transmission device with one or multiple twisted pair cable coils; a turn-off time of the current in the one or multiple twisted pair cable coils is shorter than that in a coil formed by a single wire; and the signal transmission method is implemented to radiate a time domain electromagnetic signal or a frequency domain electromagnetic signal.

* * * * *